United States Patent
Machida et al.

(10) Patent No.: US 7,273,774 B2
(45) Date of Patent: Sep. 25, 2007

(54) METHOD FOR MAKING THIN-FILM SEMICONDUCTOR DEVICE

(75) Inventors: Akio Machida, Kanagawa (JP); Hirotaka Akao, Tokyo (JP); Takahiro Kamei, Kanagawa (JP); Isamu Nakao, Kanagawa (JP)

(73) Assignee: Sony Corporation, Tokyo (JP)

( * ) Notice: Subject to any disclaimer, the term of this patent is extended or adjusted under 35 U.S.C. 154(b) by 205 days.

(21) Appl. No.: 11/236,001

(22) Filed: Sep. 27, 2005

(65) Prior Publication Data

US 2006/0079033 A1    Apr. 13, 2006

(30) Foreign Application Priority Data

Sep. 30, 2004    (JP)    ............................. 2004-286324

(51) Int. Cl.
*H01L 21/84* (2006.01)
*H01L 21/00* (2006.01)
*H01L 21/336* (2006.01)
*H01L 21/36* (2006.01)

(52) U.S. Cl. ...................... 438/166; 438/149; 438/487; 438/308; 438/795; 257/E21.133; 257/E21.134

(58) Field of Classification Search ................ 438/166, 438/149, 487, 308, 151, 795; 257/59, 72
See application file for complete search history.

(56) References Cited

U.S. PATENT DOCUMENTS

| 5,148,808 | A | * | 9/1992 | Satake ........................ 600/441 |
| 5,766,989 | A | * | 6/1998 | Maegawa et al. ........... 438/166 |
| 6,132,818 | A | * | 10/2000 | Tanaka et al. .............. 427/596 |
| 6,274,463 | B1 | * | 8/2001 | Chaiken ..................... 438/486 |
| 6,872,977 | B2 | * | 3/2005 | Hatano et al. ................ 257/64 |
| 2005/0164434 | A1 | * | 7/2005 | Arakawa et al. ............ 438/149 |
| 2006/0040436 | A1 | * | 2/2006 | Yamamoto et al. ......... 438/166 |

* cited by examiner

*Primary Examiner*—Michael Lebentritt
*Assistant Examiner*—Mohsen Ahmadi
(74) *Attorney, Agent, or Firm*—Wolf, Greenfield & Sacks, P.C.

(57) ABSTRACT

A method for making a thin-film semiconductor device includes an annealing step of irradiating an amorphous semiconductor thin film with a laser beam so as to crystallize the amorphous semiconductor thin film. In the annealing step, the semiconductor thin film is continuously irradiated with the laser beam while shifting the position of the semiconductor thin film irradiated with the laser beam at a predetermined velocity so that excess hydrogen can be removed from the region irradiated with the laser beam without evaporating and expanding hydrogen ions in the semiconductor thin film.

8 Claims, 6 Drawing Sheets

METHOD FOR MAKING THIN-FILM SEMICONDUCTOR DEVICE

CROSS REFERENCES TO RELATED APPLICATIONS

The present invention contains subject matter related to Japanese Patent Application JP 2004-286324 filed in the Japanese Patent Office on Sep. 30, 2004, the entire contents of which are incorporated herein by reference.

BACKGROUND OF THE INVENTION

1. Field of the Invention

The present invention relates to methods for making thin-film semiconductor devices and in particular to a method for making a thin-film semiconductor device, the method including an annealing step of crystallizing a semiconductor thin-film.

2. Description of the Related Art

In flat-panel displays, such as liquid crystal displays (LCDs) and organic electro-luminescence (EL) displays, thin-film transistors (TFTs) are used as the switching element for a plurality of pixels of active matrix displays. The TFTs are categorized into polycrystalline silicon TFTs having active regions composed of polycrystalline silicon (poly-Si) or microcrystalline silicon (μc-Si) and amorphous silicon TFTs having active regions composed of amorphous silicon (amorphous Si). Polycrystalline silicon TFTs have a carrier mobility 10 to 100 times higher than that of the amorphous silicon TFTs and are thus excellent as the material of the switching elements. Accordingly, in the above-described flat-panel displays, it is highly desirable to use polycrystalline silicon TFTs as the switching elements in order to enhance the resolution of displayed images and to realize a system-on-panel technology, i.e., a technology of imparting various functions to the displays by providing various functions and circuits onto display substrates.

An example of the technique for fabricating polycrystalline silicon TFTs described above is a so-called low-temperature polysilicon process that uses only temperatures up to 600° C. The low-temperature polysilicon process is developed and already put to practical application. According to this process, it is no longer necessary to use expensive, though highly heat-resistant, substrates composed of quarts, single-crystal silicon, and the like, and high-resolution flat-panel displays can be fabricated at decreased costs.

Here, in the low-temperature silicon process, semiconductor thin films are formed by CVD involving decomposition by plasma and not heat. The resulting semiconductor thin film thus contains hydrogen. In the subsequent step, the semiconductor thin film is annealed at 450° C. or higher for several hours to remove hydrogen contained in the semiconductor thin film (dehydrogenation annealing). Subsequently, crystallization annealing by excimer laser irradiation is conducted to crystallize the semiconductor thin film. During the crystallization annealing, the large substrate is pulse-irradiated while shifting the region of the laser irradiation so that the substrate surface is uniformly irradiated with laser and that the size of the crystals can be made uniform over the entire surface of the substrate (refer to Japanese Unexamined Patent Application Publication No. 2000-340506, paragraph 0021).

As is described above, in the low-temperature polysilicon process, dehydrogenation annealing is performed ahead of the crystallization annealing using laser to prevent hydrogen ablation, i.e., a destruction of a film inflicted by evaporated hydrogen caused due to laser irradiation during the crystallization annealing.

Another example of the process involves gradually increasing the energy of laser irradiation to simultaneously perform dehydrogenation annealing and crystallization annealing. According to a report, the hydrogen content was reduced to the background level by increasing the energy of excimer laser irradiation in three steps, i.e., 150 mJ/cm$^2$, 300 mJ/cm$^2$, and 375 mJ/cm$^2$ (refer to P. Mei, et al., Appl. Phys. Lett. (US) Feb. 28, 1994, vol 64(9), pp. 1132-1134).

SUMMARY OF THE INVENTION

In recent years, a process of producing a large number of elements by batch on a large substrate called "mother glass" is employed to increase the productivity of flat-panel display fabrication. The drawback of this process is the difficulty of transferring the large glass substrate and the increased scale of equipment. In order to overcome this drawback, a process that uses a plastic substrate, which is easier to handle, instead of the glass substrate has been studied. Since the plastic substrate is flexible, it can be processed by a roll-to-roll technique, and the cost of equipment can be dramatically reduced by the use of the plastic substrate.

However, even in a low-temperature polysilicon process described in Japanese Unexamined Patent Application Publication No. 2000-340506 above, a temperature of 450° C. or higher is needed for several hours in the process of dehydrogenation annealing. This temperature is higher than the heat resistant temperature of most plastic materials; hence, a process that can use the plastic substrate is not easily achievable even by the low-temperature polysilicon process.

In the process disclosed in P. Mei et al. above involving adjusting the irradiation energy in three steps, destruction of the semiconductor film due to ablation was reported. Thus, in order to prevent ablation during the annealing of this process, the irradiation energy is desirably adjusted in more than three steps, and the desired productivity is thus not achieved. In particular, this document discloses use of a 308 nm excimer laser beam during annealing. However, the laser beam of this wavelength is rapidly absorbed in the surface layer of the semiconductor thin film. Thus, in order to prevent ablation of the semiconductor thin film, the irradiation energy should be adjusted in a larger number of steps. However, it may no longer be possible to attain practical productivity.

Thus, a method for making a thin-film semiconductor device including crystallizing an amorphous semiconductor thin film, the method using a further lower process temperature and streamlining the process steps, is desirable.

A method for making a thin-film semiconductor device includes an annealing step of irradiating an amorphous semiconductor thin film with a laser beam so as to crystallize the amorphous semiconductor thin film. In the annealing step, the semiconductor thin film is continuously irradiated with the laser beam while shifting the position of the semiconductor thin film irradiated with the laser beam at a predetermined velocity so that excess hydrogen can be removed from the region irradiated with the laser beam without evaporating and expanding hydrogen ions in the semiconductor thin film.

This method prevents heat generated in the semiconductor thin film due to the laser irradiation from affecting the substrate. By continuous irradiation with the laser beam, excess hydrogen in the region irradiated with the laser beam Lh diffuses from the solid side to the liquid side at the solid-liquid interface shifting as the laser beam Lh is moved, and thereby continues to move inside the semiconductor thin film. Thus, the excess hydrogen is removed from the crystallized region. A separate dehydrogenation annealing taking several hours at 450° C. or more is no longer necessary. Since an adequate amount of hydrogen remains in the irradiated region, the dehydrogenation and the hydrogenation are simultaneously performed in the crystallized region of the semiconductor thin film in this annealing step.

Consequently, according to the above-described method, a material having low heat resistance can be used as the substrate of an advanced thin-film semiconductor device incorporating a crystallized semiconductor thin film. That is, a plastic substrate can be used, and a roll-to-roll mass-production process with decreased equipment costs can be realized.

Since crystallization, dehydrogenation, and hydrogenation of the semiconductor thin film are simultaneously performed as described above, the process for making a thin-film semiconductor device incorporating a crystallized semiconductor thin film can be streamlined, and the productivity can be increased.

DESCRIPTION OF THE PREFERRED EMBODIMENTS

The preferred embodiments of the present invention will now be described in detail with reference to drawings. In each of the embodiments below, a thin-film semiconductor device having top-gate poly-SI TFTs is used as an example, and the method for producing this thin-film semiconductor device is described first in each of the embodiments.

First Embodiment

FIGS. 1A to 1D are cross-sectional views of process steps of a method for making a thin-film semiconductor device according to a first embodiment. The method of the first embodiment will be described with reference to FIGS. 1A to 1D.

Figure 1A:
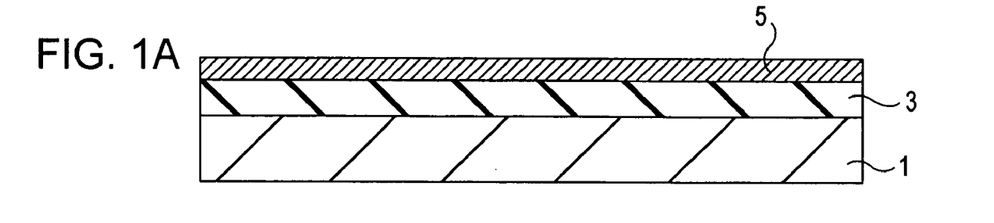
FIGS. 1A to 1D are cross-sectional views showing steps of a production process according to a first embodiment.

Referring first to FIG. 1A, a substrate 1 for forming a thin-film semiconductor device is prepared. The substrate 1 may be composed of glass, quartz, sapphire, plastic, or a metal, such as aluminum or stainless steel. An insulating buffer layer 3 for insulation is formed on a main face of the substrate 1 to prevent heat from conducting to the substrate 1. The detailed description of the substrate 1 and the buffer layer 3 are provided below.

An amorphous semiconductor thin film 5 made of amorphous silicon is then formed on the buffer layer 3 by a deposition process at a low deposition temperature. For example, plasma-enhanced chemical vapor deposition (PE-CVD) at a deposition temperature lower than 250° C., i.e., the heat resistant temperature of general plastics, may be employed to form the semiconductor thin film 5.

An example of forming the semiconductor thin film 5 by PE-CVD is as follows:

deposition gas and flow: $SiH_4$ (10 vol %)/$H_2$=50 sccm
deposition atmospheric internal pressure: 200 mTorr
substrate temperature: 130° C.
RF power: 20 W
deposition time: 6.5 min The semiconductor thin film 5 is composed of hydrogenated amorphous silicon (a-Si:H) having a high hydrogen content.

Note that the method for making the semiconductor thin film 5 is not limited to the above-described PE-CVD as long as the deposition temperature can be reduced to a low level. For example, the semiconductor thin film 5 may be made by an application method. In the application method, for example, a mixture of a polysilane and a solvent is applied onto the buffer layer 3 on the substrate 1, and the applied mixture is dried and annealed to form the semiconductor thin film 5. In any deposition method at low temperatures, such as the PE-CVD or the application method described above, the resulting semiconductor thin film 5 composed of hydrogenated amorphous silicon (A-Si:H) will contain about 0.5 to 15 at % of hydrogen, although this percentage may vary according to deposition conditions.

Figure 1B:
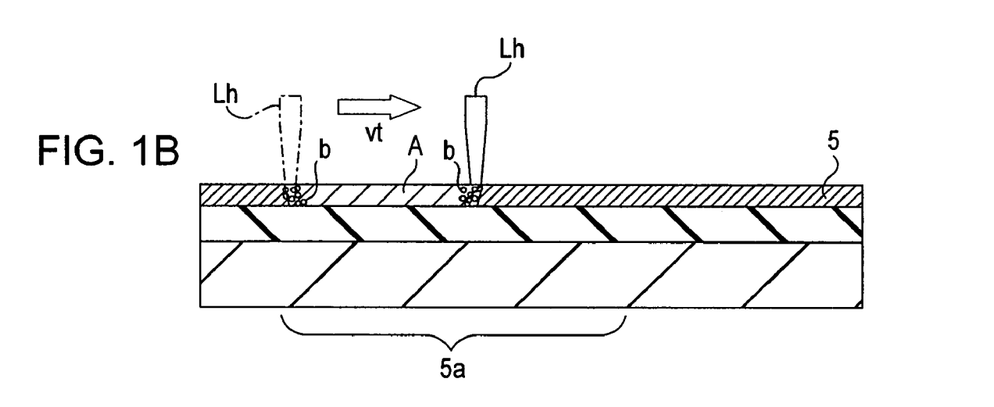

Next, as shown in FIG. 1B, the semiconductor thin film is annealed to crystallize the semiconductor thin film 5 by irradiating a selected region 5a in the semiconductor thin film 5 with a laser beam Lh.

In this annealing step, the region in the semiconductor thin film 5 irradiated with the laser beam Lh is shifted at a predetermined velocity vt. Here, the laser irradiation is continuously conducted to thereby form a crystallized region A, which is the region irradiated with the laser beam Lh. According to this process, excess hydrogen can be removed from the region irradiated with the laser beam Lh, i.e., the crystallized region A, without evaporation or expansion of hydrogen ions.

Here, the meaning of the phrase "the laser irradiation of the semiconductor thin film 5 is continuously conducted" include a case in which the laser beam Lh is moved in a completely continuous manner without any pause and a case in which the irradiation with the laser beam Lh include a pause of a duration not long enough to allow the region of the semiconductor thin film 5 melted by the irradiation to completely solidify. In other words, irradiation with pauses shorter than the irradiation time is included in the definition of "continuous irradiation" as long as this condition is satisfied. For example, irradiation of the semiconductor thin film 5 including about 10 ns to about 20 ns of pause per 100 ns of irradiation time is also included in the definition of the continuous laser irradiation. The duration of the pause relative to the irradiation time is adequately adjusted according to the material and thickness of the semiconductor thin film, the energy density of the laser beam Lh, and the like. When the irradiation includes pauses, the effect of heat generated by the laser irradiation to the substrate 1 can be suppressed. It should be noted that the excimer laser beam is a pulsed wave. A pulsed wave of about 300 Hz includes 3,300 ns of pauses relative to 25 ns of irradiation time. Accordingly, with an excimer laser beam, the next pulse irradiation is performed after the region of the semiconductor thin film 5 melted by the irradiation with the laser beam Lh is completely solidified. Thus, the excimer laser beam is not applicable to "continuous irradiation".

The wavelength of the laser beam Lh applied to the semiconductor thin film 5 is selected based on the thickness and the absorption coefficient of the semiconductor thin film 5 such that the absorption coefficient is at a relatively low level to allow the laser beam Lh to be absorbed not in the surface layer of the semiconductor thin film 5 only but in the entire region in the depth direction. For example, if the semiconductor thin film 5 composed of amorphous silicon has a thickness of 50 nm, the laser beam Lh preferably has a wavelength of 350 nm to 470 nm. In this manner, it becomes possible to prevent rapid temperature increase by absorption of the laser beam Lh in the surface layer of the semiconductor thin film 5 only and the ablation (destruction of the semiconductor thin film 5) caused by the expansion of the hydrogen contained in the film.

Examples of the oscillation source of the laser beam Lh having the above-described wavelength include a GaN compound semiconductor laser oscillator and a YAG laser oscillator.

The velocity vt of shifting the region of the semiconductor thin film 5 irradiated with the laser beam Lh is set to a level that allows the heat applied to the semiconductor thin film 5 by the laser irradiation to be released without affecting the substrate 1 and that achieves crystallization of the semiconductor thin film 5. Accordingly, the velocity vt is set to a level determined based on the energy of the laser beam Lh. In the example described above, if the energy of the laser beam is about 1 J/cm$^2$, the velocity of shifting the position of the laser irradiation of the semiconductor thin film 5 is adjusted to 0.1 m/sec to 10 m/sec.

The shifting of the position of the semiconductor thin film 5 irradiated with the laser beam Lh may be relative movement. For example, the substrate 1 supporting the semiconductor thin film 5 may be moved while fixing the laser beam Lh, or the substrate 1 may be fixed while moving the laser beam Lh, thereby shifting the position irradiated with the laser beam Lh. Alternatively, both the substrate and the laser beam Lh may be moved.

The spot diameter of the laser beam Lh applied to the semiconductor thin film 5 is determined from the probability of generating nuclei during the process of cooling the molten semiconductor material. In detail, the portion of the semiconductor material melted by the laser irradiation is sequentially cooled as the irradiated position is shifted by the relative movement of the laser beam Lh. Even in the regions where cooling started at the same time, crystals grow from the portion in which the nuclei of crystals were generated earliest. In such an event, if the probability of the nucleus generation is about 1 event/sec, a single crystal can be grown in the portion that has started to cool, and polycrystals having larger crystal grain diameters can be obtained thereby.

Thus, in the above-described example, the spot diameter of the laser beam Lh applied on the semiconductor thin film 5 is preferably 10 μm or less to suppress the probability of nucleus generation to about 1 event/sec. From the standpoint of productivity, the spot diameter is preferably as large as possible. In this regard, the spot diameter is set to a level as large as possible without exceeding 10 μm. The lower limit of the practical spot diameter from the standpoint of the productivity is about 1 nm.

If the spot diameter is smaller than the width of the crystallized region A of the selected region 5a, the laser irradiation of the selected region 5a is conducted using a column of a plurality of laser beams Lh.

As described above, the semiconductor thin film 5 is continuously irradiated with the laser beam Lh. As a consequence, excess hydrogen in the region irradiated with the laser beam Lh diffuses from the solid side to the liquid side at the solid-liquid interface shifting as the laser beam Lh is moved, and thereby continues to move inside the semiconductor thin film 5. Thus, the excess hydrogen is removed from the crystallized region A. The excess hydrogen b is precipitated at the ends of the crystallized region A by forming voids.

The irradiation of the semiconductor thin film 5 with the laser beam Lh described above is conducted on only the selected region 5a of the semiconductor thin film 5 in which crystallization is desired. In this manner, the heat locally produced in the semiconductor thin film 5 by the irradiation of the selected region 5a with the laser beam Lh is released to the surrounding regions, and the substrate 1 is prevented from being affected by the heat.

Here, the region that is desired to be crystallized, i.e., the selected region 5a, is a region of the semiconductor thin film 5 in which an element, such as a transistor or capacitor, or wiring is formed and is a region desirably having lower resistance.

The irradiation of the semiconductor thin film 5 with the laser beam Lh is preferably conducted on a plurality of the selected regions 5a simultaneously (multiple point irradiation). In detail, as shown in the plan view of FIG. 2, each of the plurality of selected regions 5a aligned on the substrate 1 is preferably irradiated with the laser beam Lh at the same time so that a plurality of crystallized regions A can be formed at the same time. This is preferable from the standpoint of productivity.

Figure 2:
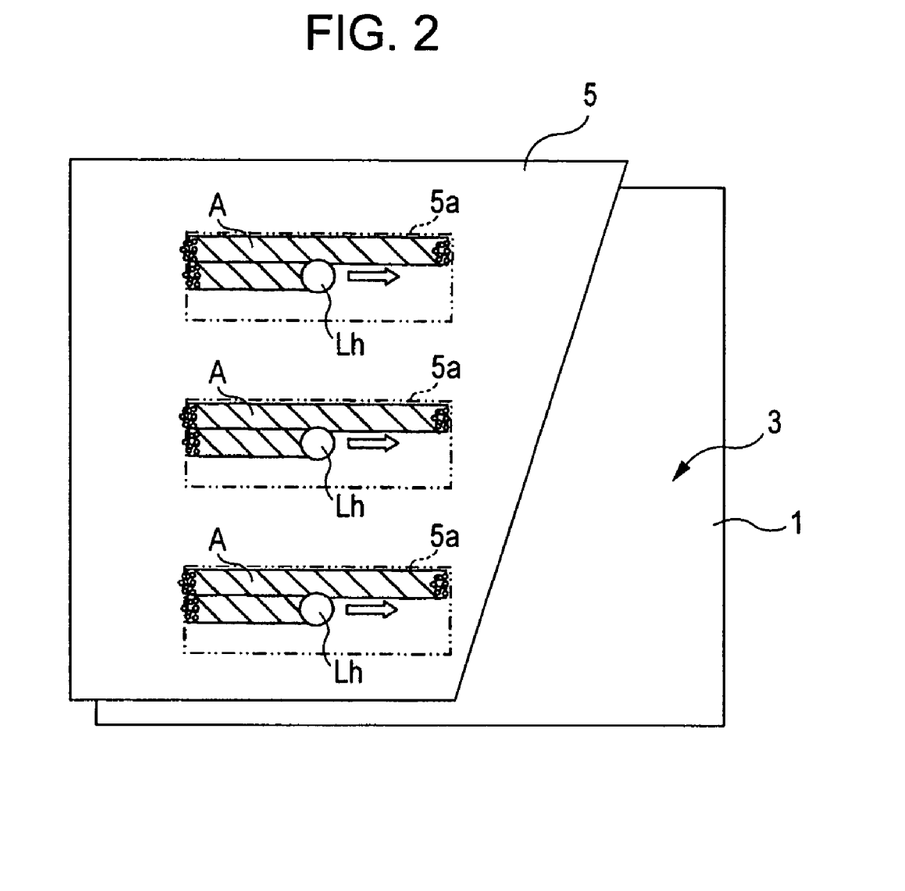
FIG. 2 is a plan view showing multiple point irradiation in an annealing step.

In order to realize the multiple point irradiation with the laser beams Lh, semiconductor laser oscillators are preferably used as the oscillation sources of the laser beams Lh. Since the semiconductor laser oscillators are significantly smaller than other laser oscillators such as excimer lasers and YAG lasers, a plurality of semiconductor laser oscillators can be incorporated in one apparatus. Moreover, the semiconductor laser oscillators can achieve rated output of 40 mW or more and desirably 60 mW or more by continuous irradiation. The configuration of the laser apparatus incorporating such semiconductor laser oscillators is described below.

Figure 1C:
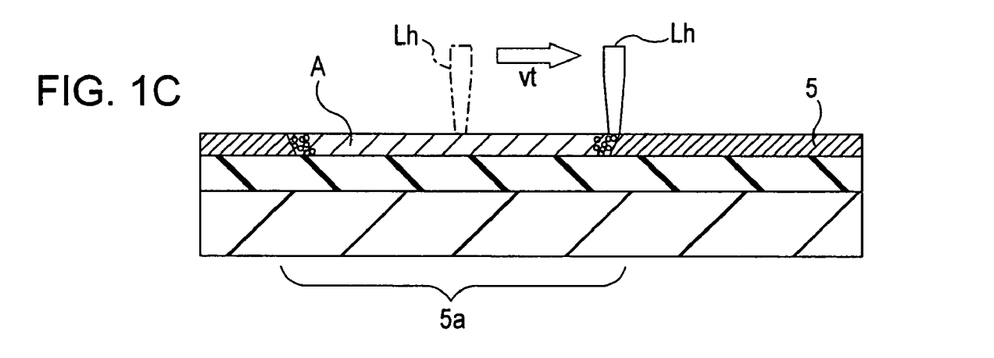

As a result of the annealing described above, the crystallized region A formed by crystallizing the selected region 5a of the semiconductor thin film 5 is produced as shown in FIG. 1C, while removing excess hydrogen in the crystallized region A. During this annealing step, excess hydrogen migrates inside the semiconductor thin film 5 as the position irradiated with the laser beam Lh is shifted so that excess hydrogen b can be precipitated by forming voids at the end of the crystallized region A at which the irradiation is terminated.

Figure 3:
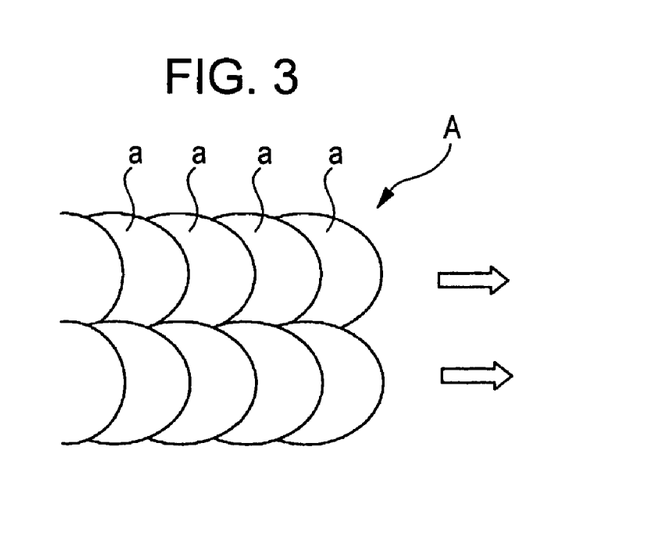
FIG. 3 is a plan view for explaining crystal grains obtained by the annealing step.

As a result of the continuous irradiation conducted by moving the laser beam Lh at a predetermined velocity described above, crystal grains a of the semiconductor materials are formed in the crystallized region A, as shown in the plan vies of FIG. 3. In other words, in the crystallized region A, crescent-shaped crystal grains a protruding in the direction of the movement of the laser beam Lh indicated by the arrows are aligned in the direction of the movement of the laser beam Lh. Note that in FIG. 3, the crystal grains of two rows of the regions irradiated with the laser beams Lh are depicted.

An experiment was conducted by irradiating a semiconductor thin film 5 (composed of a-Si:H), having a thickness of 50 nm and being formed by PE-CVD, with a laser beam traveling at a velocity vt of 8.2 m/sec and having an output equivalent to 1 J/cm$^2$. The observation of the resulting film confirmed that the resulting film was a polycrystalline film containing aligned crescent-shaped crystal grains a having a width of 800 nm and a length of 100 nm in the laser beam traveling direction. At the end of the crystallized region A of the selected region 5 at which the laser irradiation was terminated, defects (voids) resulting from precipitation of excess hydrogen b were observed. Moreover, similar defects were locally observed at the end of the film at which the laser irradiation is started and in the region where solidification proceeded in a direction opposite to the movement of the laser beam.

Upon completion of the annealing step described above, as shown in FIG. 1D, a gate insulating film 7 is formed on the semiconductor thin film 5 on the substrate 1. The gate insulating film 7 may be composed of silicon oxide and may be formed by normal PE-CVD technique widely known. Alternatively, the gate insulating film 7 may be formed by application, such as by a spin-on-glass (SOG) technique.

Figure 1D:
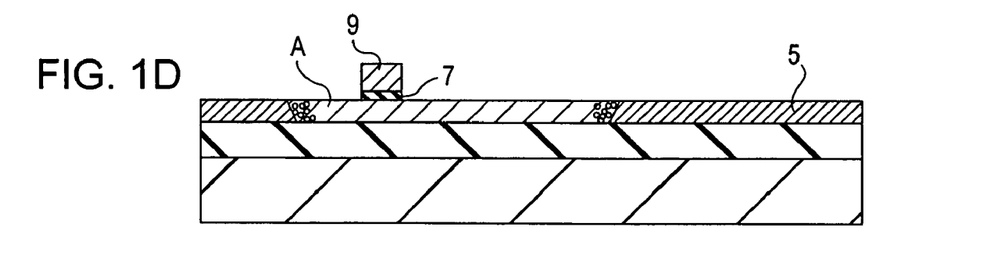

Next, a gate electrode 9 extending across the center portion of the crystallized region A in the semiconductor thin film 5 is formed on the gate insulating film 7. In detail, an electrode material, such as aluminum, is first deposited by sputtering or vapor deposition, and then a resist pattern is formed in the layer of the electrode material by lithography. Subsequently, the layer of the electrode material is etched through the resist pattern serving as a mask to form the gate electrode 9 by patterning. Note that the formation of the gate electrode 9 is not limited to the above-described process. A technique of applying metal nanoparticles by printing may be used instead, for example.

Next, the gate insulating film 7 is pattern-etched through the gate electrode 9 serving as a mask to expose the portions of the crystallized region A at both sides of the gate electrode 9.

Figure 4A:
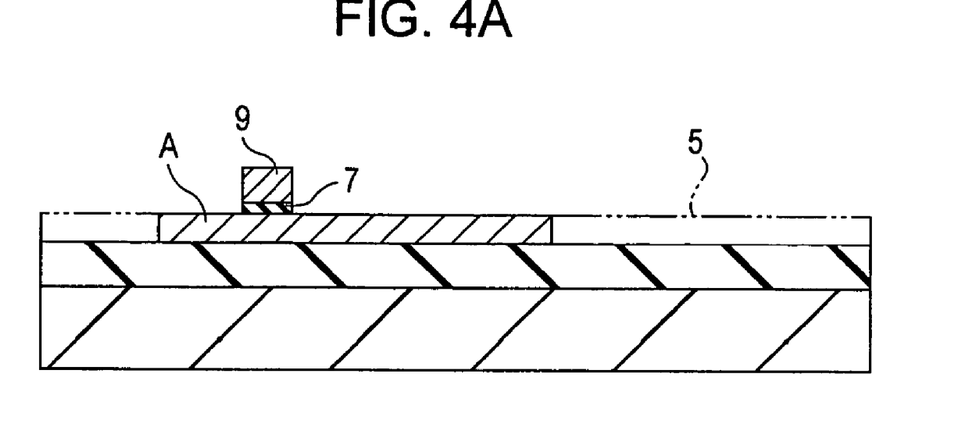
FIGS. 4A and 4B are cross-sectional views showing steps of the production process according to the first embodiment.

Next, as shown in FIG. 4A, the semiconductor thin film 5 is pattern-etched into a predetermined shape while leaving the crystallized region A of the semiconductor thin film 5. During this step, as shown in the drawing, the excess hydrogen b precipitated at the ends of the crystallized region A may or may not be etched away.

Figure 4B:
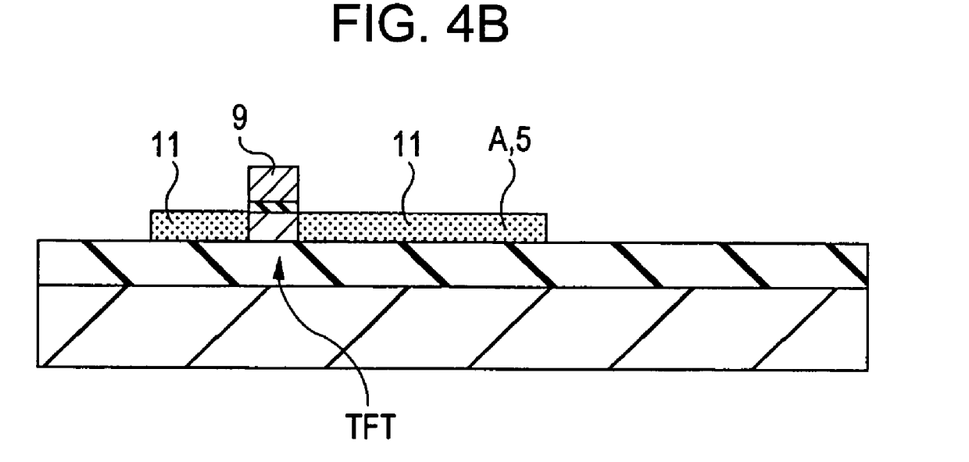

Then, as shown in FIG. 4B, source/drain 11 doped with an impurity are formed on the semiconductor thin film 5, which has been patterned into a shape including the crystallized region A, by self alignment using the gate electrode 9 as a mask. Here, a known technique, such as ion implantation or plasma doping, may be employed. A laser-induced melting of pre-deposited impurity doping (LIMPID) technique, a technique using a commercially available, coating dopant solution, or the like is also usable.

For example, in order to introduce the impurity by LIMID, the semiconductor thin film 5 is exposed to plasma of a dopant gas containing the impurity. For example, a PE-CVD apparatus is charged with 20 sccm of a dopant gas PH$_3$ (0.5 vol %)/H$_2$, and the semiconductor thin film 5 is irradiated for three minutes while adjusting the pressure of the process atmosphere to 475 mTorr, the substrate temperature to 150° C., and the RF power to 20 W. In this manner, the impurity ions are selectively adsorbed onto the exposed portions of the semiconductor thin film 5 through the gate electrode 9 serving as a mask. Subsequently, the plasma-treated semiconductor thin film 5 is irradiated with laser beams to introduce and activate the impurity in the semiconductor thin film 5. Here, the laser irradiation is conducted in the same manner as that explained with reference to FIGS. 1B and 1C.

As a result, the source and drain 11 are formed by self-alignment by introducing the impurity in the portions of the semiconductor thin film 5 (the crystallized region A) on the both sides of the gate electrode 9. In the region below the gate electrode 9, a channel containing no impurity is formed in the crystallized region A. The source and drain 11 and the channel below the gate electrode 9 are composed of polycrystalline silicon in the crystallized region A of the semiconductor thin film 5. Thus, a top-gate TFT including a polycrystalline silicon thin-film, i.e., polycrystalline silicon TFT, is formed as the thin-film semiconductor device.

Note that when the excess hydrogen b is left at the ends of the crystallized region A in the step of patterning the semiconductor thin film 5 described with reference to FIG. 4A, the resulting TFT will have regions containing many bubble-like defects due to the excess hydrogen b at the outer sides of the source and drain 11.

Moreover, in forming the TFT described above, the patterning of the semiconductor thin film 5 described with reference to FIG. 4A may be performed at any desirable timing as long as it is performed after the annealing step shown in FIG. 1C.

In making a display, e.g., a liquid crystal display, using the TFTs as switching elements, the following additional steps are performed.

Figure 5A:
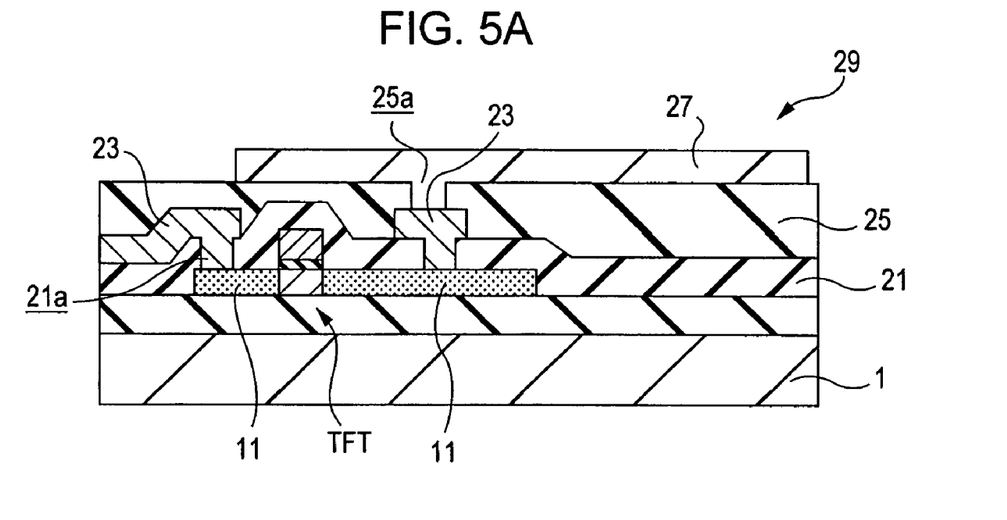
FIGS. 5A and 5B are cross-sectional views of steps showing formation of a display, the steps performed after the steps of the first embodiment.

First, as shown in FIG. 5A, an interlayer insulating film 21 is formed to cover the TFT on the substrate 1. Connection holes 21a reaching the source and drain 11 of the TFT are then formed in the interlayer insulating film 21. Leads 23 that connect with the source and drain 11 through the connection holes 21a are formed on the interlayer insulating film 21.

A planarizing insulating film 25 is formed to cover the leads 23, and a connecting hole 25a reaching the lead 23 is formed in the planarizing insulating film 25. On the planarizing insulating film 25, a pixel electrode 27 that connects to the source and drain 11 through the connecting hole 25a and the lead 23 is formed. The pixel electrode 27 serves as a transparent electrode or a reflective electrode depending on the type of the liquid crystal display. The drawing in FIG. 5A is a partial cross sectional view of a substantial part of one pixel.

Although not shown in the drawing, an alignment film covering the pixel electrode 27 is formed on the planarizing insulating film 25. Thus, a driving substrate 29 is made.

Figure 5B:
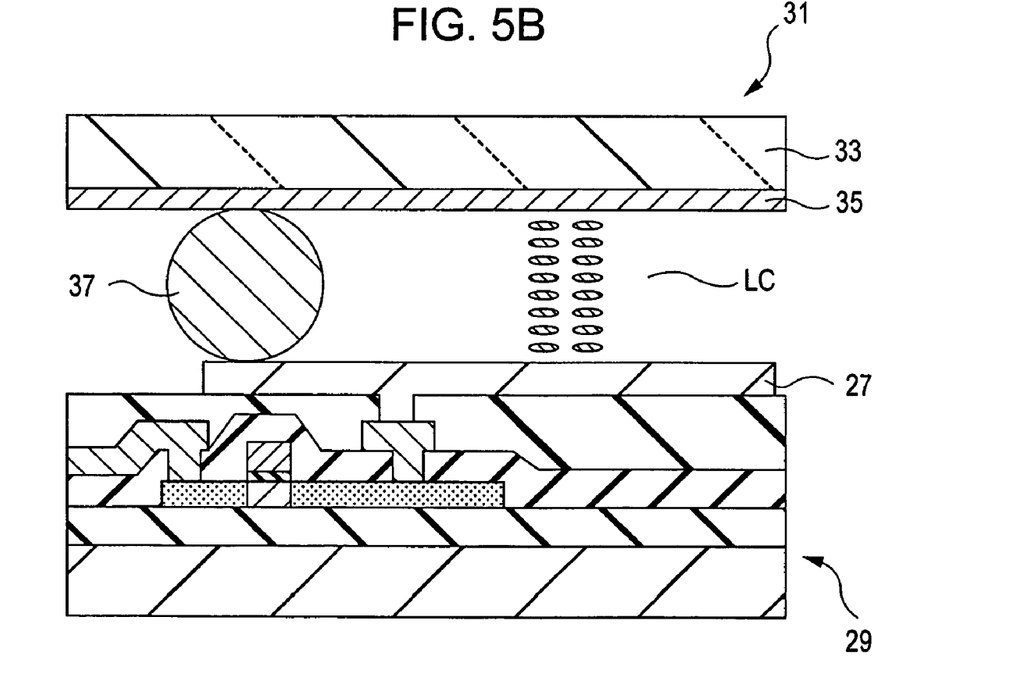

Next, as shown in FIG. 5B, a counter substrate 31 to be disposed opposing the driving substrate 29 is prepared. The counter substrate 31 includes a transparent substrate 33, a common electrode 35, and an alignment film (not shown) covering the common electrode 35. The common electrode 35 is a transparent electrode.

The driving substrate 29 and the counter substrate 31 are then combined with a spacer 37 therebetween so that the pixel electrode 27 faces the common electrode 35. A liquid crystal layer LC is sealed inside the gap between the substrates 29 and 31 formed to a predetermined dimension by the spacer 37 to complete fabrication of the liquid crystal display.

Note that when the driving substrate 29 is used to produce an organic EL display, the pixel electrode formed on the driving substrate 29 serves as the anode (or cathode), organic layers having desired functions, such as a hole injection layer, an emission layer, an electron transport layer, and the like, are deposited on the pixel electrode, and a common electrode serving as the cathode (or anode) is formed on these organic layers.

According to the method described above, in the annealing step of crystallizing the semiconductor thin film 5 described with reference to FIGS. 1B and 1C, the substrate 1 is prevented from being affected by the heat generated in the semiconductor thin film 5 by laser irradiation since the position of laser irradiation is shifted at a predetermined velocity vt with respect to the semiconductor thin film 5. Thus, the influence of the heat on the substrate during the annealing step can be reduced to a low level.

In the annealing step, the semiconductor thin film 5 is continuously irradiated with the moving laser beam Lh. In this manner, the excess hydrogen generated in the region irradiated with the laser light keeps moving inside the semiconductor thin film as the position irradiated with the laser beam is shifted. Thus, excess hydrogen can be removed from the crystallized area. Thus, a separate dehydrogenation annealing process taking several hours at 450° C. or more is no longer necessary. This also reduces the influence of the heat on the substrate 1.

As described above, the influence of the heat on the substrate 1 during the thin-film semiconductor device production process is reduced. Thus, advanced functions can be achieved with the crystallized semiconductor thin film 5, and the substrate 1 of the thin-film semiconductor device can be made of a material having low heat resistance. As a result, a plastic substrate can be used as the substrate 1, and a roll-to-roll mass-production process with decreased equipment costs can be realized, for example. It should be noted here that when the production is conducted by a roll-to-roll technique, the thickness of the plastic substrate is preferably 1 mm or less.

In the annealing step described above, although excess hydrogen b is removed from the region (crystallized region A) irradiated with the laser beam Lh, some hydrogen remains in the crystallized region A. Thus, dehydrogenation and hydrogenation in the crystallized region A of the semiconductor thin film 5 can be simultaneously conducted in this annealing step. Thus, the process of producing advanced-function thin-film semiconductor device can be streamlined, and the productivity can be increased thereby.

Second Embodiment

FIGS. 6A to 6D are cross-sectional views of process steps of a method for making a thin-film semiconductor device according to a second embodiment. The method of the second embodiment will be described with reference to FIGS. 6A to 6D.

Figure 6A:
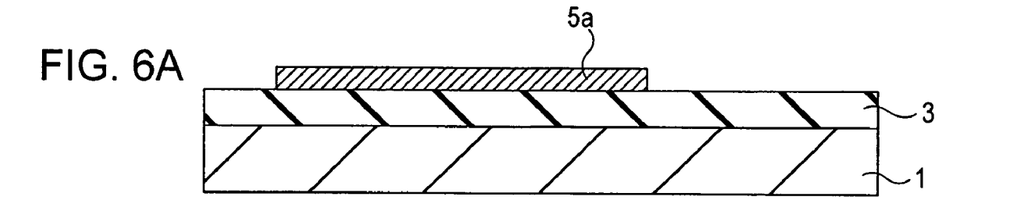
FIGS. 6A to 6D are cross-sectional views showing steps of a production process according to a second embodiment.

Referring first to FIG. 6A, a buffer layer 3 is formed on a substrate 1 in the same manner as the first embodiment described with reference to FIG. 1A. A semiconductor thin-film pattern 5a is formed on the buffer layer 3. The semiconductor thin-film pattern 5a has the same shape as the selected region 5a in the first embodiment. The semiconductor thin-film pattern 5a preferably has a shape including the selected region 5a described in the first embodiment and thus may be larger than the selected region 5a.

The semiconductor thin-film pattern 5a may be formed by a method in which the deposition temperature is low. As in the first embodiment, the semiconductor thin-film pattern 5a may be formed by pattern-etching a semiconductor thin film deposited. Alternatively, for example, the application method described in the first embodiment may be employed to form by printing the semiconductor thin-film pattern 5a on the target region only. The resulting semiconductor thin-film pattern 5a is thus composed of hydrogenated amorphous silicon (a-Si:H), as with the semiconductor thin film 5 of the first embodiment.

Figure 6B:
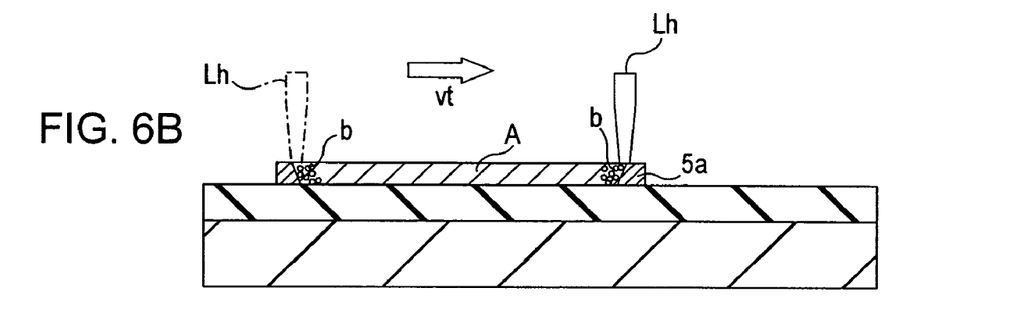

Next, as shown in FIG. 6B, the semiconductor thin-film pattern 5a is irradiated with a laser beam Lh to crystallize the semiconductor thin-film pattern 5a by annealing. This annealing step is conducted in the same manner as the annealing step in the first embodiment described with reference to FIGS. 1B and 1C so that the fabrication of the crystallized region A (the crystallized semiconductor thin-film pattern 5a) and removal of the excess hydrogen in the crystallized region A (dehydrogenation) can be simultaneously performed. As in the first embodiment, excess hydrogen b in the form of voids is precipitated at the ends of the crystallized region A as a result of this annealing step.

Figure 7:
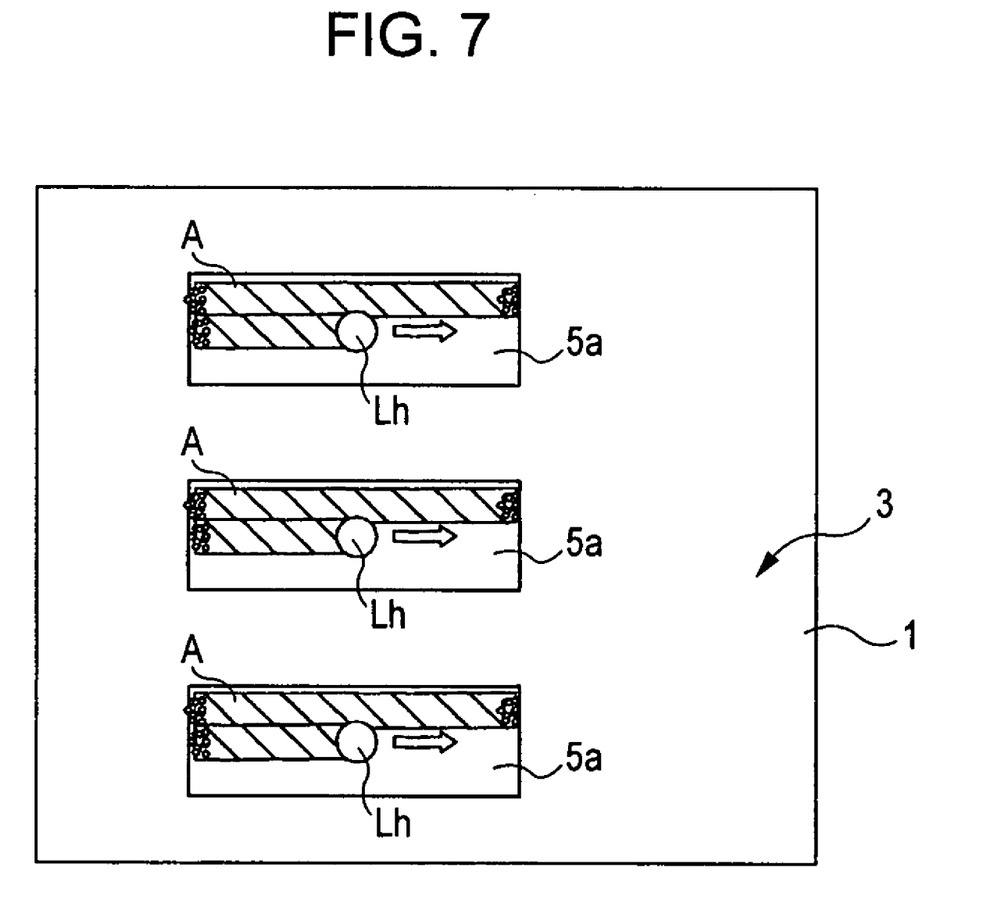
FIG. 7; is a plan view showing multiple point irradiation in an annealing step.

As in the annealing step of the first embodiment, it is preferable to simultaneously anneal a plurality of crystallized regions A. In detail, as shown in the plan view of FIG. 7, two or more semiconductor thin-film patterns 5a formed on the substrate 1 are preferably irradiated with laser beams Lh simultaneously (multiple point irradiation) to simultaneously form a plurality of crystallized regions A from the standpoint of productivity.

Figure 6C:
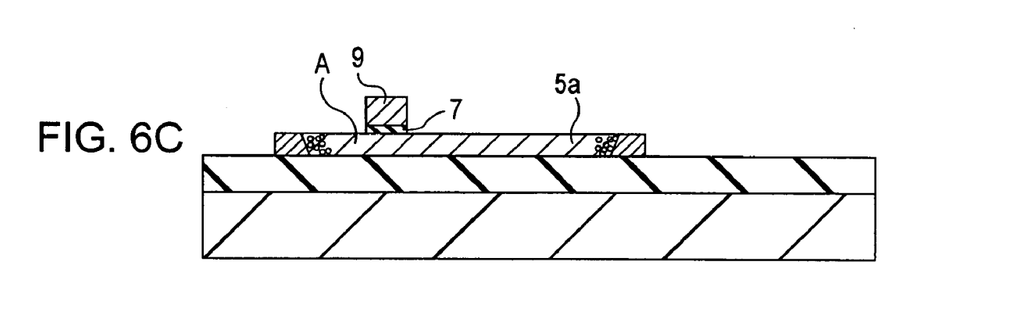

Next, as shown in FIG. 6C, a gate electrode 9 is formed on the gate insulating film 7 on the semiconductor thin-film pattern 5a on the substrate 1. This step may be performed in the same manner as the step of first embodiment described with reference to FIG. 1D. The gate electrode 9 is formed across the center of the crystallized region A of the semiconductor thin-film pattern 5a.

Figure 6D:
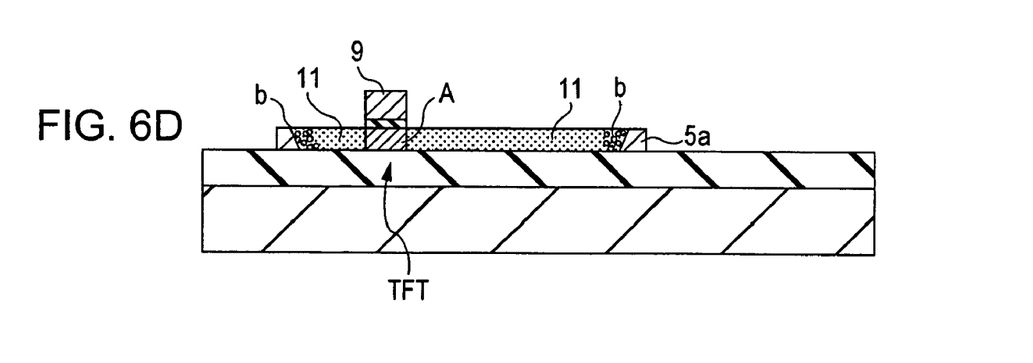

Next, referring to FIG. 6D, source and drain 11 doped with an impurity are formed on the crystallized region A of the semiconductor thin-film pattern 5a by self-alignment using the gate electrode 9 as a mask. This step may be performed in the same manner as the first embodiment described with reference to FIG. 4B.

As a result, the source and drain 11 doped with the impurity are formed by self-alignment in the crystallized region A at the both sides of the gate electrode 9, as in the first embodiment. A channel is formed below the gate electrode 9 and in the portion of the crystallized region A not doped with the impurity. Thus, a top-gate TFT composed of polycrystalline silicon is made.

In making a display, e.g., a liquid crystal display, using the TFTs as switching elements, the same additional steps as in the first embodiment described with reference to FIGS. 5A and 5B are performed.

According to the second embodiment described above, annealing for crystallizing the semiconductor thin-film pattern 5a described with reference to FIG. 6B is conducted in the same manner as the annealing step of the first embodiment. Thus, the influence of the heat on the substrate 1 during the production process can be reduced to a low level, and the same advantages as the first embodiment can be achieved.

Although the above-described first and second embodiments described application to the process of producing thin-film semiconductor device incorporating a top-gate polycrystalline silicon TFT, the application of the invention is not limited to these. The present invention is applicable to a wide range of processes for producing thin-film semiconductor devices incorporating the step of crystallizing amorphous semiconductor thin films. The same effects can be obtained by applying the above-described annealing step by the laser irradiation to these processes.

<Substrate>

The substrate 1 used in the methods of producing the thin-film semiconductor devices exemplified in the first and second embodiments will now be described in detail.

As is described above, according to the methods for making the thin-film semiconductor devices of the embodiments, the influence of the heat on the substrate can be reduced during the annealing step. Thus, the substrate is not required to have high heat resistance and may be composed of various materials. For example, a glass substrate, a quartz substrate, a sapphire substrate, a plastic substrate, a metal substrate, such as an aluminum substrate and a stainless-steel substrate, and the like are usable as the substrate.

In using a metal substrate, an insulating buffer layer 3 is deposited on the face of the metal substrate onto which the thin-film semiconductor device is formed. The buffer layer 3 may be composed of silicon oxide, silicon nitride, silicon carbide, or an oxide of Ti, Al, Zr, Hf, and the like. The buffer layer 3 may be formed by a known vacuum deposition technique, such as CVD, sputtering, or vapor deposition. The buffer layer 3 may be an insulating layer commonly used as an interlayer insulating film, such as an inorganic or organic SOG film. Alternatively, the buffer layer 3 may be a dielectric film formed by anode oxidation of a metal film, or a film produced by a known technique, such as a sol-gel technique or metalorganic deposition (MO).

When a plastic substrate is used, the process of producing the thin-film semiconductor device described above can be performed by a roll-to-roll process. The thickness of the plastic substrate 1 is preferably 1 mm or less.

Examples of the organic material of the plastic substrate include polymers, e.g., polyesters such as polyethylene terephthalate (PET), polyethylene naphthalate, and polycarbonate; polyolefins such as polypropylene; polyphenylene sulfides such as polyphenylene sulfide; polyamides; aromatic polyamides; polyether ketones; polyimides, acrylic resins; and polymethyl methacrylates (PMMA). Among these, common plastic materials such as polyethylene terephthalate, acetate, polyphenylene sulfide, polycarbonate, polyether sulfone (PES), polystyrene, nylon, polypropylene, polyvinyl chloride, acrylic resins, and PMMA are preferred for use as the plastic substrate.

The thickness of the plastic substrate described above is preferably as small as possible and is, for example, about 200 μm. At such a thickness, the thin-film semiconductor device becomes flexible, smaller, and thinner.

In using the plastic substrate, a coating layer composed of an organic material is formed on the surface of the substrate onto which the thin-film semiconductor device is to be formed, and then an insulating buffer layer 3 composed of an inorganic material is formed on the coating layer. As in the case of using the metal substrate, the buffer layer 3 may be composed of silicon oxide, silicon nitride, silicon carbide, or an oxide of Ti, Al, Zr, Hf, or the like. The coating layer has, for example, a thickness of about 10 μm, and is composed of an organic material having a thermal expansion coefficient smaller than that of the underlying plastic substrate. The coating layer is preferably composed of a so-called hard coating material, i.e., a material that maintains a certain degree of hardness up to a relatively high temperature of 200° C. and has high compactness and high hardness.

Examples of such a coating material include acrylic resins, epoxy resins, and polymeric materials containing any one or combination of these each bonded by three-dimensional condensation polymerization resulting from the deformation caused by optical or thermal processes.

Examples of the coating material containing an acrylic resin include acrylic resin-based polymeric materials and composite polymeric plastic materials containing acrylic resins and other resins. In particular, preferable examples of such a coating material include various polyfunctional acrylate compounds such as ethylene glycol di(meth)acrylate, neopentyl glycol di(meth)acrylate, bisphenol-A di(meth)acrylate, trimethylolpropane tri(meth)acrylate, pentaerythritol tri(meth)acrylate, dipentaerythritol, and difunctional acrylate compounds prepared by reacting 2,2-bis(4'-hydroxyphenyl)hexafluoropropane or its alkylene glycol ether with isocyanatoalkyl (meth)acrylate. Here, the type of comonomers differs depending on the field of the application and any copolymerizable monomers can be used.

The coating material is usually composed of monomers having a molecular weight of about 100 to about 1,000 and containing one or more unsaturated sites. The coating material desirably contains 99 to 100 wt %, preferably 99.9 to 100 wt %, and most preferably 100 wt % of reactive components and solid materials. Examples of the solid materials include nonvolatile solid materials such as polymeric substances and colloidal silica. Preferable polymeric materials include cellulose acetate butyrate.

The coating material is preferably one that can be converted into 100% solid components by exposure to UV light. Such a material contains a suitable amount of photoinitiator to cause solidification of the coating material by the light irradiation. The coating material may include a particular amount of potential UV-blocking agent such as resorcinol monobenzoate.

Examples of the epoxy resin-containing coating materials include organosilicon compounds, substances called epoxy silanes, which are hydrolysate of the organosilicon compounds, and hydrolysate of the epoxy silanes. Examples of such a coating material include γ-glycidoxypropyltrimethoxysilane, γ-glycidoxypropyltriethoxysilane, γ-glycidoxypropyltrimethoxyethoxysilane, γ-glycidoxypropyltriacetoxysilane, β-(3,4-epoxycyclohexyl)ethyltrimethoxysilane, β-(3,4-epoxycyclohexyl)ethyltriethoxysilane, β-(3,4-epoxycyclohexyl)ethyltrimethoxyethoxysilane, β-(3,4-epoxycyclohexyl)ethyltriacetoxysilane, γ-glycidoxypropyldimethoxymethylsilane, γ-glycidoxypropyldiethoxymethylsilane, γ-glycidoxypropyldimethoxyethoxymethylsilane, γ-glycidoxypropyldiacetoxymethylsilane, β-(3,4-epoxycyclohexyl)ethyldimethoxymethylsilane, β-(3,4-epoxycyclohexyl)ethyldiethoxymethylsilane, β-(3,4-epoxycyclohexyl)ethyldimethoxyethoxymethylsilane, β-(3,4-epoxycyclohexyl)ethyldiacetoxymethylsilane, γ-glycidoxypropyldimethoxyethylsilane, γ-glycidoxypropyldiethoxyethylsilane, γ-glycidoxypropyldimethoxyethoxyethylsilane, γ-glycidoxypropyldiacetoxyethylsilane, β-(3,4-epoxycyclohexyl)ethyldimethoxyethylsilane, β-(3,4-epoxycyclohexyl)ethyldiethoxyethylsilane, β-(3,4-epoxycyclohexyl)ethyldimethoxyethoxyethylsilane, β-(3,4-epoxycyclohexyl)ethyldiacetoxyethylsilane, γ-glycidoxypropyldimethoxyisopropylsilane, γ-glycidoxypropyldiethoxyisopropylsilane, γ-glycidoxypropyldimethoxyethoxyisopropylsilane, γ-glycidoxypropyldiacetoxyisopropylsilane, β-(3,4-epoxycyclohexyl)ethyldiethoxyisopropylsilane, β-(3,4-epoxycyclohexyl)ethyldiethoxyisopropylsilane, β-(3,4-epoxycyclohexyl)ethyldimethoxyethoxyisopropylsilane, β-(3,4-epoxycyclohexyl)ethyldiacetoxyisopropylsilane, γ-glycidoxypropylmethoxydimethylsilane, γ-glycidoxypropylethoxydimethylsilane, γ-glycidoxypropylmethoxyethoxydimethylsilane, γ-glycidoxypropylacetoxydimethylsilane, β-(3,4-epoxycyclohexyl)ethylmethoxydimethylsilane, β-(3,4-epoxycyclohexyl)ethylethoxydimethylsilane, β-(3,4-epoxycyclohexyl)ethylmethoxyethoxydimethylsilane, β-(3,4-epoxycyclohexyl)ethylacetoxydimethylsilane, γ-glycidoxypropylmethoxydiethylsilane, γ-glycidoxypropylethoxydiethylsilane, γ-glycidoxypropylmethoxyethoxydiethylsilane, γ-glycidoxypropylacetoxydiethylsilane, β-(3,4-epoxycyclohexyl)ethylmethoxydiethylsilane, β-(3,4-epoxycyclohexyl)ethylethoxydiethylsilane, β-(3,4-epoxycyclohexyl)ethylmethoxyethoxydiethylsilane, β-(3,4-epoxycyclohexyl)ethylacetoxydiethylsilane, γ-glycidoxypropylmethoxydiisopropylsilane, γ-glycidoxypropylethoxydiisopropylsilane, γ-glycidoxypropylmethoxyethoxydiisopropylsilane, γ-glycidoxypropylacetoxydiisopropylsilane, β-(3,4-epoxycyclohexyl)ethylmethoxydiisopropylsilane, β-(3,4-epoxycyclohexyl)ethylethoxydiisopropylsilane, β-(3,4-epoxycyclohexyl)ethylmethoxyethoxydiisopropylsilane, β-(3,4-epoxycyclohexyl)ethylacetoxydiisopropylsilane, γ-glycidoxypropylmethoxyethoxymethylsilane, γ-glycidoxypropylacetoxymethoxymethylsilane, γ-glycidoxypropylacetoxyethoxymethylsilane, β-(3,4-epoxycyclohexyl)ethylmethoxyethoxymethylsilane, β-(3,4-epoxycyclohexyl)ethylmethoxyacetoxymethylsilane, β-(3,4-epoxycyclohexyl)ethylethoxyacetoxymethylsilane, γ-glycidoxypropylmethoxyethoxyethylsilane, γ-glycidoxypropylacetoxymethoxyethylsilane, γ-glycidoxypropylacetoxyethoxyethylsilane, β-(3,4-epoxycyclohexyl)ethylmethoxyethoxyethylsilane, β-(3,4-epoxycyclohexyl)ethylmethoxyacetoxyethylsilane, β-(3,4-epoxycyclohexyl)ethylethoxyacetoxyethylsilane, γ-glycidoxypropylmethoxyethoxyisopropylsilane, γ-glycidoxypropylacetoxymethoxyisopropylsilane, γ-glycidoxypropylacetoxyethoxyisopropylsilane, β-(3,4-epoxycyclohexyl)ethylmethoxyethoxyisopropylsilane, β-(3,4-epoxycyclohexyl)ethylmethoxyacetoxyisopropylsilane, β-(3,4-epoxycyclohexyl)ethylethoxyacetoxyisopropylsilane, glycidoxymethyltrimethoxysilane, glycidoxymethyltriethoxysilane, α-glycidoxyethyltrimethoxysilane, α-glycidoxymethyltrimethoxysilane, β-glycidoxyethyltrimethoxysilane, β-glycidoxymethyltrimethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylmethyldiethoxysilane, α-glycidoxypropylmethyldimethoxysilane, α-glycidoxypropylmethyldiethoxysilane, β-glycidoxypropylmethyldimethoxysilane, β-glycidoxypropylmethyldiethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylmethylethoxysilane, γ-glycidoxypropylmethyldiphenoxysilane, γ-glycidoxypropylethyldimethoxysilane, γ-glycidoxypropylethyldiethoxysilane, γ-glycidoxypropylethyldipropoxysilane, γ-glycidoxypropylvinyldimethoxysilane, and γ-glycidoxypropylvinyldiethoxysilane.

These coating materials may be used alone or in combination depending on the purpose. They may be mixed with other silane compounds. Examples of the other silane compounds include various trialkoxysilanes such as methyltrimethoxysilane, methyltriethoxysilane, vinyltrimethoxysilane, vinyltriethoxysilane, vinyltriacetoxysilane, vinyltrimethoxyethoxysilane, γ-methacryloxypropyltrimethoxysilane, aminomethyltrimethoxysilane, 3-aminopropyltrimethoxysilane, 3-aminopropyltriethoxysilane, phenyltrimethoxysilane, phenyltriethoxysilane, γ-chloropropyltrimethoxysilane, γ-mercaptopropyltriethoxysilane, and 3,3,3-trifluoropropyltrimethoxysilane; triacyloxysilane or trialkoxysilane compounds; dialkoxysilane compounds such as dimethyldimethoxysilane, diphenyldimethoxysilane, methylphenyldimethoxysilane, methylvinyldimethoxysilane, and dimethyldiethoxysilane; and tetrafunctional silane compounds such as methyl silicate, ethyl silicate, isopropyl silicate, n-propyl silicate, n-butyl silicate, tert-butyl silicate, and sec-butyl silicate.

There are numerous other hard coating materials such as acrylic resin-based polymeric materials produced by three-dimensional polycondensation and having high compactness and hardness, composite polymeric plastic materials containing acrylic resins and other resins, epoxy-based resins containing organosilicon compounds and its hydrolysates, and the hydrolysates of the epoxy-based resins. The examples above are provided for the illustrative purposes only.

The method for forming the organic polymeric layer (coating layer) may be as follows. An acrylic resin, an epoxy resin, or a polymeric material containing the acrylic and epoxy resin is combined with a filler, water, or an organic solvent as required, and the resulting mixture is dispersed using a paint shaker, a sand mill, a pearl mill, a ball mill, an attritor, a roll mill, a high-speed impeller disperser, a jet mill, a high-speed impact mill, an ultrasonic wave disperser or the like to prepare a coating material. In the event that the adhesion between the hard coating material and the plastic substrate is not high enough, an adhesive layer is preferably provided therebetween. The adhesive layer may be formed on the plastic substrate during the process of making the plastic film or may be formed afterward by application.

Next, the coating material is applied onto one or both surfaces of the substrate to form a single layer or a multiple layer on each surface. Examples of the technique for applying the coating material include coating techniques such as spin coating, air-doctor coating, blade coating, knife coating, reverse coating, transfer roll coating, gravure roll coating, kiss coating, cast coating, spray coating, slot orifice coating, calender coating, electrodeposition coating, dip coating, and die coating; letterpress techniques such as flexography; intaglio printing techniques such as direct gravure coating and offset gravure printing; surface printing techniques such as offset printing; and stencil printing techniques such as screen printing. When the coating material contains a solvent, the coating material is dried under heating after the application.

Next, if necessary, a solution containing a polysilazane or siloxane compound and containing 0 to 50 wt % and more preferably 0 to 30 wt % of a $CH_3$ group is applied. Examples of the technique for applying the solution include coating techniques such as spin coating, air-doctor coating, blade coating, knife coating, reverse coating, transfer roll coating, gravure roll coating, kiss coating, cast coating, spray coating, slot orifice coating, calender coating, electrodeposition coating, dip coating, and die coating; letterpress techniques such as flexography; intaglio printing techniques such as direct gravure coating and offset gravure printing; surface printing techniques such as offset printing; and stencil printing techniques such as screen printing. The applied solution is dried, heated, or irradiated with UV light to form an inorganic buffer layer (partly containing an organic component), as necessary. The heating may be performed in water vapor atmosphere if necessary. The inorganic buffer layer (partly containing the organic component) forms a firm thermal buffer layer when combined with the hard coating material. Thus, the resulting film is resistant to heat treatment at a relatively high temperature applied from the substrate surface side, and can be advantageously used in the laser crystallization process.

<Laser Apparatus>

An example of the laser apparatus usable in making thin-film semiconductor devices, such as those exemplified in the first and second embodiments, will now be described according to the optical path of the laser beam.

The laser apparatus includes a plurality of GaN semiconductor laser oscillators (hereinafter simply referred to as "oscillators"). A plurality of laser beams generated from the oscillators each passes through a collimation lens, a beam-forming anamorphic prism, and then a scanning unit. Each laser beam that has entered the scanning unit is concentrated on each selected region in the substrate 1 via an objective lens.

The scanning unit may be of a polygon mirror type, a galvanometer mirror type, an acousto-optic deflector (AOD) type, a micro-scanning mirrors (MSMS) type, or the like. While concentrating the laser beam on the substrate 1 by the combination with a focus lens, the laser beam can be scanned.

The scanning unit may include a half mirror so that a 830 nm laser beam rarely absorbable in the semiconductor thin film (a-Si:H) can be introduced to the same optical path as that of the laser beam used for the annealing process. As a result, the laser beam can be introduced to the AF sensor to enable focus servo. Similarly, if necessary, a mechanism that can capture the light entering the region with a CCD and that can align the irradiated regions is provided.

In order to increase the mount density of the scanning units, the scanning unit may be separated from the rest of the system. For example, light transmitted through the anamorphic prism is introduced to an optical fiber, and the light that has passed through the optical fiber is applied to a collimation lens and then introduced to the scanning unit. According to this scheme, the scanning unit and the AF servo mechanism can be separated from the system. Thus, the process area in one unit can be reduced, and the productivity can be increased.

For example, when a GaN laser apparatus including an object lens having an effective Na 0.6 and having a rated power of 60 mW and a substantially optical efficiency of 0.5, an average energy density of 17.7 $mW/cm^2$ is achieved. Thus, by increasing the scanning velocity of the laser beam to about 8.2 m/S, the time taken for the laser beam to pass through one point in the semiconductor thin film, i.e., the irradiation time, is about 100 ns. Thus, irradiation with a maximum energy corresponding to 1.77 $J/cm^2$ is possible.

When a semiconductor thin film (a-Si:H) 50 nm in thickness deposited by PE-CVD was irradiated with a beam having energy corresponding to 1 $J/cm^2$, a polycrystalline film containing aligned crescent-shaped crystal grains having a width of about 800 nm and a length of about 100 nm in the laser beam traveling direction was observed. At the end of the region where the irradiation with the laser beam was terminated, defects (voids) resulting from precipitation of excess hydrogen after solidification of the semiconductor material were observed. At the other end of the region where the irradiation with the laser beam was started and where solidification proceeded in a direction opposite of the traveling direction of the laser beam, similar defects were locally observed. This is the same as the description of the first embodiment.

It should be understood by those skilled in the art that various modifications, combinations, sub-combinations and alterations may occur depending on design requirements and other factors insofar as they are within the scope of the appended claims or the equivalents thereof.

What is claimed is:

1. A method for making a thin-film semiconductor device, the method comprising:
    an annealing step of irradiating an amorphous semiconductor thin film with a laser beam so as to crystallize the amorphous semiconductor thin film,
    wherein, in the annealing step, a plurality of the selected regions in the semiconductor thin film are simultaneously irradiated, and;
    wherein, in the annealing step, the semiconductor thin film is continuously irradiated with the laser beam while shifting the position of the semiconductor thin film irradiated with the laser beam at a predetermined velocity so that excess hydrogen can be removed from the region irradiated with the laser beam without evaporating and expanding hydrogen ions in the semiconductor thin film, and further;
    wherein, in the annealing step, the excess hydrogen travels inside the semiconductor thin film along with the shifting of the region irradiated with the laser beam and is precipitated in the region of the semiconductor thin film at which the irradiation with the laser beam is terminated.

2. The method according to claim 1, wherein, in the annealing step, the laser beam has a wavelength of 350 nm to 470 nm.

3. The method according to claim 1, wherein, in the annealing step, the laser beam is generated by a GaN compound semiconductor laser oscillator.

4. The method according to claim 1, wherein, in the annealing step, only a selected region in the semiconductor thin film is continuously irradiated with the laser beam.

5. The method according to claim 4, wherein the semiconductor thin film is patterned to include the selected region.

6. The method according to claim 1, wherein, in the annealing step, the velocity of the shifting laser beam is adjusted to 0.1 m/sec to 10 m/sec.

7. The method according to claim 1, wherein, in the annealing step, the laser beam has a spot diameter not exceeding 10 μm on the semiconductor thin film.

8. The method according to claim 1, wherein the semiconducor thin film is disposed on a plastic substrate.

* * * * *